(12) United States Patent
Miyazaki et al.

(10) Patent No.: US 9,229,337 B2
(45) Date of Patent: Jan. 5, 2016

(54) SETTING METHOD OF EXPOSURE APPARATUS, SUBSTRATE IMAGING APPARATUS AND NON-TRANSITORY COMPUTER-READABLE STORAGE MEDIUM

(71) Applicant: TOKYO ELECTRON LIMITED, Tokyo (JP)

(72) Inventors: Shinobu Miyazaki, Koshi (JP); Hiroshi Tomita, Koshi (JP); Shuji Iwanaga, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 582 days.

(21) Appl. No.: 13/645,887

(22) Filed: Oct. 5, 2012

(65) Prior Publication Data
US 2013/0088696 A1    Apr. 11, 2013

(30) Foreign Application Priority Data
Oct. 7, 2011    (JP) .................................. 2011-223079

(51) Int. Cl.
*G03B 27/52*    (2006.01)
*G03F 7/20*    (2006.01)

(52) U.S. Cl.
CPC ........ *G03F 7/70641* (2013.01); *G03F 7/70525* (2013.01); *G03F 7/70625* (2013.01)

(58) Field of Classification Search
CPC ............ G03F 7/70525; G03F 7/70625; G03F 7/70641

USPC ................................................. 355/55, 53, 77
See application file for complete search history.

(56) References Cited

U.S. PATENT DOCUMENTS 7,273,685 B2 *    9/2007    Sasazawa et al. ............... 430/30

FOREIGN PATENT DOCUMENTS

| JP | 2002-93697 A | 3/2002 |
|----|----|----|
| JP | 2009-229479 A | 10/2009 |
| WO | 2009/091034 A1 | 7/2009 |
| WO | 2011/135867 A1 | 11/2011 |

* cited by examiner

*Primary Examiner* — Peter B Kim
(74) *Attorney, Agent, or Firm* — Nath, Goldberg & Meyer; Jerald L. Meyer

(57) ABSTRACT

A method of setting an exposure apparatus to expose exposure sectors defined on a resist film formed on a surface of a substrate with proper values of an exposure amount and a focus value for forming a pattern having a predetermined dimension includes exposing and developing an exposure sector defined on a reference substrate by a first exposure apparatus having a first state, and imaging the same. The method exposes and develops exposure sectors defined on an inspection substrate by a second exposure apparatus having a second state where at least one of the exposure amount and the focus value is unknown, and forms and images a pattern on the inspection substrate. The method determines the proper values for the exposure amount and the focus value for the second state based on luminance of the exposure sector of reference data and luminances of the exposure sectors of inspection data.

10 Claims, 12 Drawing Sheets

Difference between inspection wafer and reference wafer

SETTING METHOD OF EXPOSURE APPARATUS, SUBSTRATE IMAGING APPARATUS AND NON-TRANSITORY COMPUTER-READABLE STORAGE MEDIUM

CROSS-REFERENCE TO RELATED APPLICATION

This application claims the benefit of Japanese Patent Application No. 2011-223079, filed on Oct. 7, 2011, in the Japan Patent Office, the disclosure of which is incorporated herein in its entirety by reference.

TECHNICAL FIELD

The present disclosure relates to a method of setting an exposure amount and a focus value of an exposure apparatus, a substrate imaging apparatus for use in the setting method, and a non-transitory storage medium for storing a program to cause a computer to perform the setting method.

BACKGROUND

In a semiconductor device manufacturing process using a photolithography technique, for example, a resist coating process of coating a resist onto a semiconductor wafer (hereinafter referred to simply as "wafer") to form a resist film, an exposure process of exposing a predetermined pattern on the resist film, and a developing process of developing the exposed resist film are performed in order so that a resist pattern is formed on the wafer.

The dimension (line width) of the resist pattern is determined by an exposure amount and a focus value set in an exposure apparatus which is configured to perform the exposure process. The exposure amount and the focus value are set based on a dimension of an intended resist pattern. The focus value corresponds to a distance between an objective lens installed in the exposure apparatus and the wafer. Since the exposure amount and the focus value may change with time, the exposure amount and the focus value are set to prevent changes in the dimension of the resist pattern even if the exposure amount and the focus value change. Specifically, the exposure amount and the focus value are set to have a wider margin.

A variation in an output from a light source or lens distortions caused by environmental factors such as a temperature and humidity may cause the focus value and the exposure amount to be changed as described above, which causes an offset between a set value and an actual value with respect to time. For this reason, an operation of periodically checking the relationship of the exposure amount and the focus value with a dimension of each pattern is performed. If desired, a correction is performed on the exposure amount and the focus value. In the checking operation, a wafer called an FEM (Focus Exposure Matrix) wafer is formed and used. Details of the FEM wafer will be described in embodiments. The FEM wafer is formed by changing the focus value and the exposure amount with respect to each shot (one exposure) on the wafer with a resist film formed thereon, performing a sequence of subsequent exposure and developing processes, and forming a pattern on a plurality of exposure sectors of the wafer, respectively. A line width of the resist pattern formed on each of the exposure sectors is measured using an optical CD (Critical Dimension) measuring unit or an equipment called a critical dimension SEM (Scanning Electron Microscope) configured to measure a dimension of a pattern.

However, measuring the dimension of the pattern at each of the exposure sectors requires a long period of time, which leads to spending a lot of time in setting of the exposure apparatus, thereby making it difficult to increase production efficiency of the exposure apparatus. Conventionally, there is a technology in which the FEM wafer is formed to provide a simulation model which is used in manufacturing a photo mask of the exposure apparatus, and measures a line width of the pattern. Unfortunately, this technology fails to address the above mentioned problems.

SUMMARY

The present disclosure provides to a setting method of an exposure apparatus and a substrate imaging apparatus for use in the setting method, which are capable of shortening a time needed to set an exposure amount and a focus value.

According to one embodiment of the present disclosure, a method of setting an exposure apparatus to expose exposure sectors defined on a resist film formed on a surface of a substrate with proper values of an exposure amount and a focus value for forming a pattern having a predetermined dimension includes exposing and developing an exposure sector defined on a reference substrate by a first exposure apparatus having a first state where each of the proper values for the exposure amount and the focus value is determined, and imaging the reference substrate on which the pattern is formed to obtain reference data including luminance of the exposure sector of the reference substrate. The method further includes exposing and developing a plurality of exposure sectors defined on an inspection substrate by a second exposure apparatus having a second state where at least one of the exposure amount and the focus value is unknown, and forming a pattern on the inspection substrate, wherein the exposure amount and the focus value differ in each of the plurality of exposure sectors of the inspection substrate. Additionally, the method includes imaging the inspection substrate with the pattern formed thereon, and obtaining inspection image data including luminances of the plurality of exposure sectors, and determining the proper values for the exposure amount and the focus value for the second state based on the luminance of the exposure sector of the reference data and the luminances of each of the exposure sectors of the inspection image data.

According to another embodiment of the present disclosure, provided is a substrate imaging apparatus for use in setting an exposure apparatus to exposure an exposure sector defined on a resist film formed on a surface of a substrate with proper values for an exposure amount and a focus value for forming a pattern having a predetermined dimension. The apparatus includes a reference image data storing unit configured to store reference data including luminance of an exposure sector defined on a reference substrate, wherein the reference data is obtained by exposing and developing the exposure sector of the reference substrate by a first exposure apparatus having a first state where each of the proper values for the exposure amount and the focus value is determined, forming a pattern on the reference substrate, and imaging the reference substrate with the pattern. The apparatus also includes an imaging unit configured to image an inspection substrate having a plurality of patterns formed by exposing and developing a plurality of exposure sectors defined on the inspection substrate so that the exposure amount and the focus value are changed for each of the plurality of exposure sectors by a second exposure apparatus having a second state where at least one of the exposure amount and the focus value is unknown. Further, the apparatus includes an inspection image data storing unit configured to store an inspection image data including luminances of each of the plurality of exposure sectors of the inspection substrate, and a determination unit configured to determine the proper values for the exposure amount and the focus value under the second state based on the luminance of the reference data stored in the reference image data storing unit and the luminances of the inspection image data stored in the inspection image data storing unit.

According to yet another embodiment of the present disclosure, provided is a non-transitory computer-readable storage medium storing a program for causing a computer to perform the method of setting an exposure apparatus to expose exposure sectors defined on a resist film formed on a surface of a substrate with proper values of an exposure amount and a focus value for forming a pattern having a predetermined dimension as described above for use in a substrate imaging apparatus configured to image an inspection substrate having a pattern which is formed by exposing and developing a plurality of exposure sectors defined on the inspection substrate with different exposure amounts and focus values with regard to each of the exposure sectors, by an exposure apparatus having a state where at least one of the exposure amount and the focus value is unknown.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
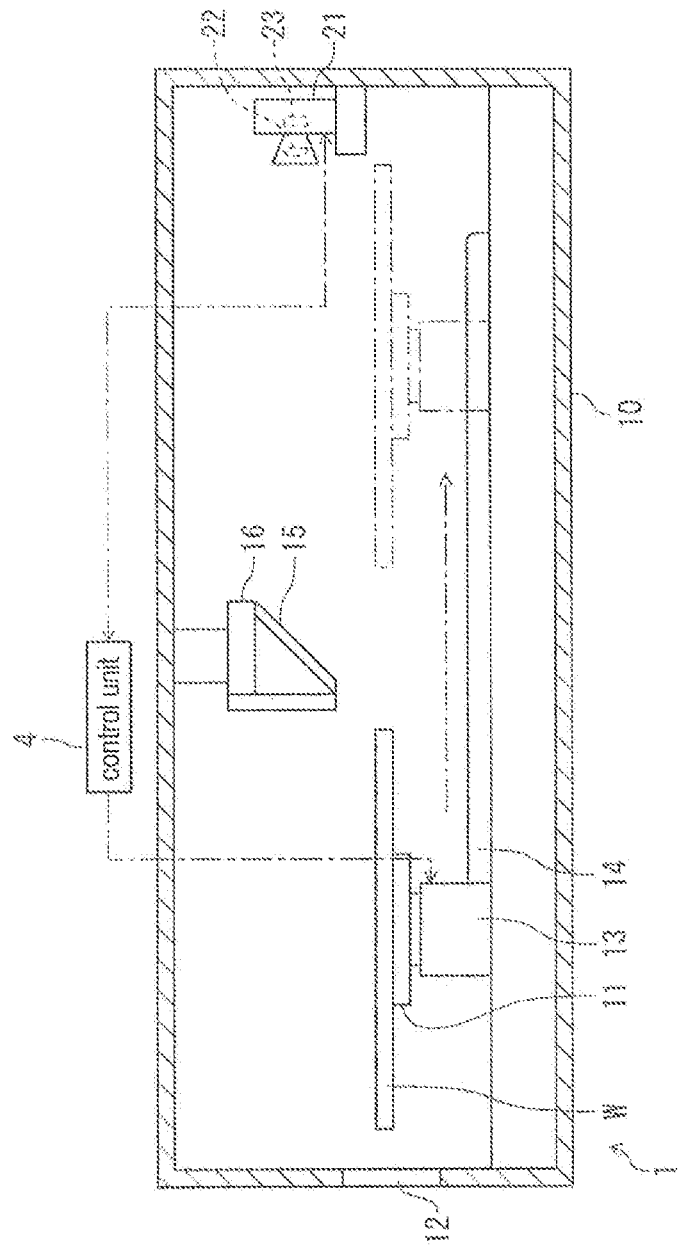
FIG. 1 is a longitudinal side elevational view of a substrate imaging apparatus for use in a setting method of an exposure apparatus according to the present disclosure.
Figure 2:
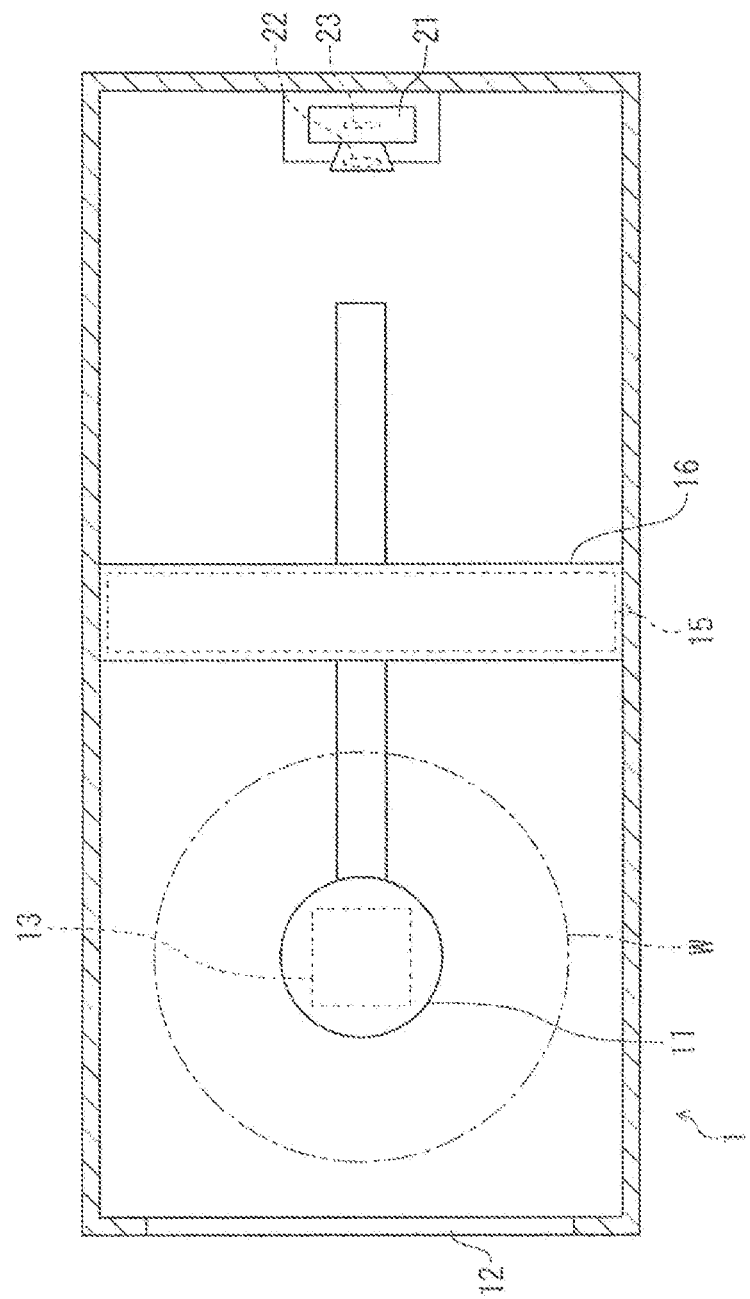
FIG. 2 is a transverse side elevational view of the substrate imaging apparatus shown in FIG. 1.

A substrate imaging apparatus 1 for use in a setting method of an exposure apparatus will be now described according to the present disclosure. FIGS. 1 and 2 are a longitudinal side elevational view and a transverse side elevational view of the substrate imaging apparatus 1, respectively. The substrate imaging apparatus 1 includes a loading table 11 configured to adsorb the center of a rear surface side of a wafer W loaded into a housing 10 so as to horizontally hold the wafer W. In FIG. 1, a reference numeral 12 represents a transfer port through which the wafer W is loaded/unloaded into/from the housing 10. The wafer W will be described later.

The loading table 11 is supported by a horizontal driving unit 13. It is assumed that a side at which the transfer port 12 is disposed is referred to as a front side. A guide rail 14 inwardly extends on the bottom surface of the substrate imaging apparatus 1 in a direction from the front side. The horizontal driving unit 13 is configured to horizontally move along the guide rail 14.

A transversally-extending semi-transparent mirror 15, which extends to the left and right sides of the housing 10, is installed above the guide rail 14. The semi-transparent mirror 15 is obliquely installed with respect to the extension direction of the guide rail 14. An illumination unit 16, which is configured to illuminate light downward through the semi-transparent mirror 15, is installed above the semi-transparent mirror 15.

An imaging camera 21 is installed at an inner side of the housing 10 relative to the semi-transparent mirror 15. The imaging camera 21 includes a lens 22, and an imaging element group 23 made of a plurality of CCD (Charge Coupled Device) elements and configured to receive an image caught by the lens 22. An analog signal outputted from the imaging element group 23 is converted into a digital signal by an A/D converter (not shown), and the converted digital signal is provided to a control unit 4, which will be described later.

Light provided from the illumination unit 16 passes through the semi-transparent mirror 15 and is applied onto an illumination area below the semi-transparent mirror 15. Then, light reflected off an object, which is positioned at the illumination area, is reflected at the semi-transparent mirror 15, and the reflected light is captured by the imaging camera 21. That is, the imaging camera 21 is capable of imaging the object positioned below the semi-transparent mirror 15. When the wafer W inwardly moves from the front side within the housing 10 along the guide rail 14 in the lower side of the semi-transparent mirror 15, the imaging camera 21 intermittently images a surface of the wafer W in response to a control signal provided from the control unit 4, thereby imaging the entire surface of the wafer W.

Figure 3:
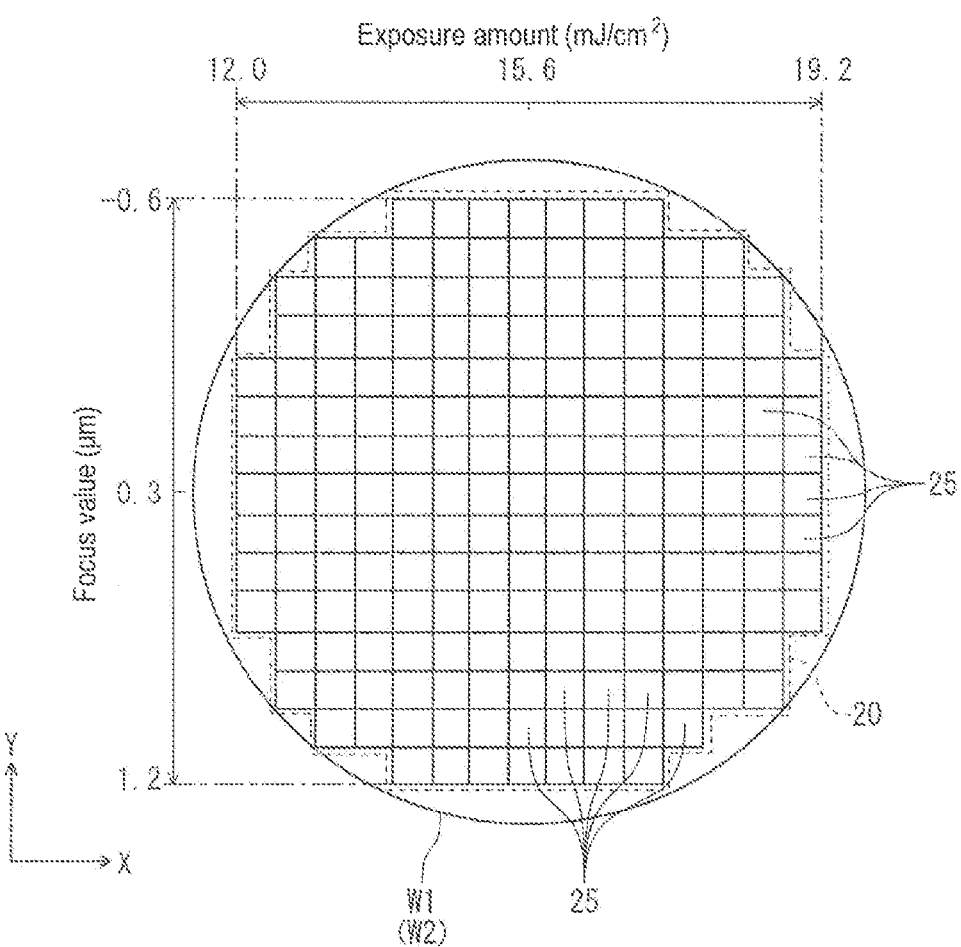
FIG. 3 is a plane view of an FEM (Focus Exposure Matrix) wafer.

The wafer W imaged by the substrate imaging apparatus 1 will now be described with reference to FIG. 3. The wafer W is called an FEM (Focus Exposure Matrix) wafer. On the surface of the wafer W, a plurality of rectangular exposure sectors 25 are defined adjacent each other in a matrix form on a pattern forming area 20 excluding an edge portion. It is assumed that an arrangement direction of each of the exposure sectors 25 is set to X and Y directions, respectively, and the size of each of the exposure sectors 25 in the X and Y directions are set to equal to each other. Further, the number of the exposure sectors 25 shown in FIG. 3 is shown to be smaller than that of exposure sectors actually defined.

A resist film is formed on the surface of the wafer W, and the resist film is exposed by an exposure apparatus in a state where different focus values and different exposure amounts are set for the exposure sectors 25. Specifically, within one exposure sector 25, the same focus value and the same exposure amount are used. The exposure amount set at each of the exposure sectors 25 increases as it goes from one end of the X direction to the other end, and respective difference in exposure amounts between adjacent exposure sectors 25 along the X direction is set to be equal to each other. Further, the focus value set at each of the exposure sectors 25 increases as it goes from one end of the Y direction to the other end, and respective difference in focus values between adjacent exposure sectors 25 along the Y direction is set to be equal to each other. After the wafer W is exposed to light, the wafer W is then developed so that the resist pattern is formed on each of the exposure sectors 25.

However, as described above, the focus value and the exposure amount of the exposure apparatus in actual practice may be different from set values corresponding thereto. The wafer W formed by exposing each of the exposure sectors 25 by the exposure apparatus in a state where a set value for the exposure amount and a set value for the focus value are proper to form a resist pattern having a desired dimension is referred to as a "reference wafer W1" or a "reference substrate"). In this reference wafer W1, for example, the exposure sector 25 positioned at the center thereof is exposed with the proper set value for the focus value and the proper set value for the exposure amount as described above. In one embodiment, the set value for the exposure amount is 15.6 mJ/cm$^2$ and the set value for the focus value is 0.3 μm. Each of the exposure sectors 25 is exposed in a state where the exposure amount is variably set in the range of 12.0 mJ/cm$^2$ to 19.2 mJ/cm$^2$, and the focus value is variably set in the range of −0.6 μm to 1.2 μm, respectively. The difference in the set value for the exposure amount between a exposure sector and the adjacent exposure sector in X direction is 0.3 mJ/cm$^2$, and the difference in the set value for the focus value between a exposure sector and the adjacent exposure sector in Y direction is 0.1 μm. The proper set value for the exposure amount and the proper set value for the focus value correspond to a proper value for an exposure amount and a proper value for a focus value, which are recited in Claims of the present disclosure, respectively. Hereinafter, for the sake of simplicity, the proper set value for the exposure amount and the proper set value for the focus value are sometimes referred to as a proper exposure amount and a proper focus value, respectively.

After a predetermined time has lapsed from the formation of the reference wafer W1, a wafer, which is referred to as an "inspection wafer W2" or an "inspection substrate," is formed. Each of the exposure sectors 25 positioned at the same position as that of each of the exposure sectors 25 of the reference wafer W1 is exposed with the same set value for the exposure amount and the focus value as those set at the time of the formation of the reference wafer W1, by the exposure apparatus utilized in the exposure of the reference wafer W1. In other words, each exposure sector of the inspection wafer W2 is exposed with the same set value for the exposure amount and the focus value as that were applied to each sector of the reference wafer W1. However, in practice, the exposure amount and the focus value at the time of the formation of the inspection wafer W2 may be different from those at the time of the formation of the reference wafer W1. This causes a difference in dimensions of patterns between the corresponding exposure sectors 25 in the reference wafer W1 and the inspection wafer W2.

Next, an operation of determining the proper exposure amount and the proper focus value to be applied to the reference wafer W1 will be described. First, the aforementioned FEM wafer W is formed. While in one embodiment, the exposure amount and the focus value to be applied to each of the exposure sectors 25 of the reference wafer W1, are set in the range of 12.0 to 19.2 mJ/cm$^2$ and in the range of −0.6 to 1.2 μm, respectively, in some embodiments, these ranges may be modified in any other suitable form. Further, the dimension of each of the exposure sectors 25 in the FEM wafer W is measured, and the proper exposure amount and the proper focus value for obtaining a dimension of an intended pattern are determined based on the measurement results.

Thereafter, the determined proper the exposure amount and the proper focus value are set to an exposure amount and a focus value (in this example, 15.6 mJ/cm$^2$ and 0.3 μm, respectively) of the exposure sector 25 positioned at the center of the reference wafer W1. Thus, the dimension of the pattern of the center exposure sector 25 is predetermined By changing the exposure amount in the X direction by a predetermined value and changing the focus value in the Y direction by a predetermined value as described above, an exposure amount and a focus value for each of the exposure sectors 25 other than one positioned at the center are determined In this embodiment, the exposure amount and the focus value of the exposure sector 25 are positioned at the center of the reference wafer W1.

Next, a description will be made with respect to the outline of a process performed in the substrate imaging apparatus 1. This process utilizes the fact that a luminance (brightness) of a respective exposure sector 25 is changed according to a line width of a resist pattern formed on the respective exposure sector 25 of each wafer W. The luminance (brightness) is an intensity of a secondary light source (i.e., an intensity of light oriented to the imaging camera 21 from the wafer W as an object), and is represented as a brightness (gray level) of an image. The luminance is a unitless number.

Figure 4:
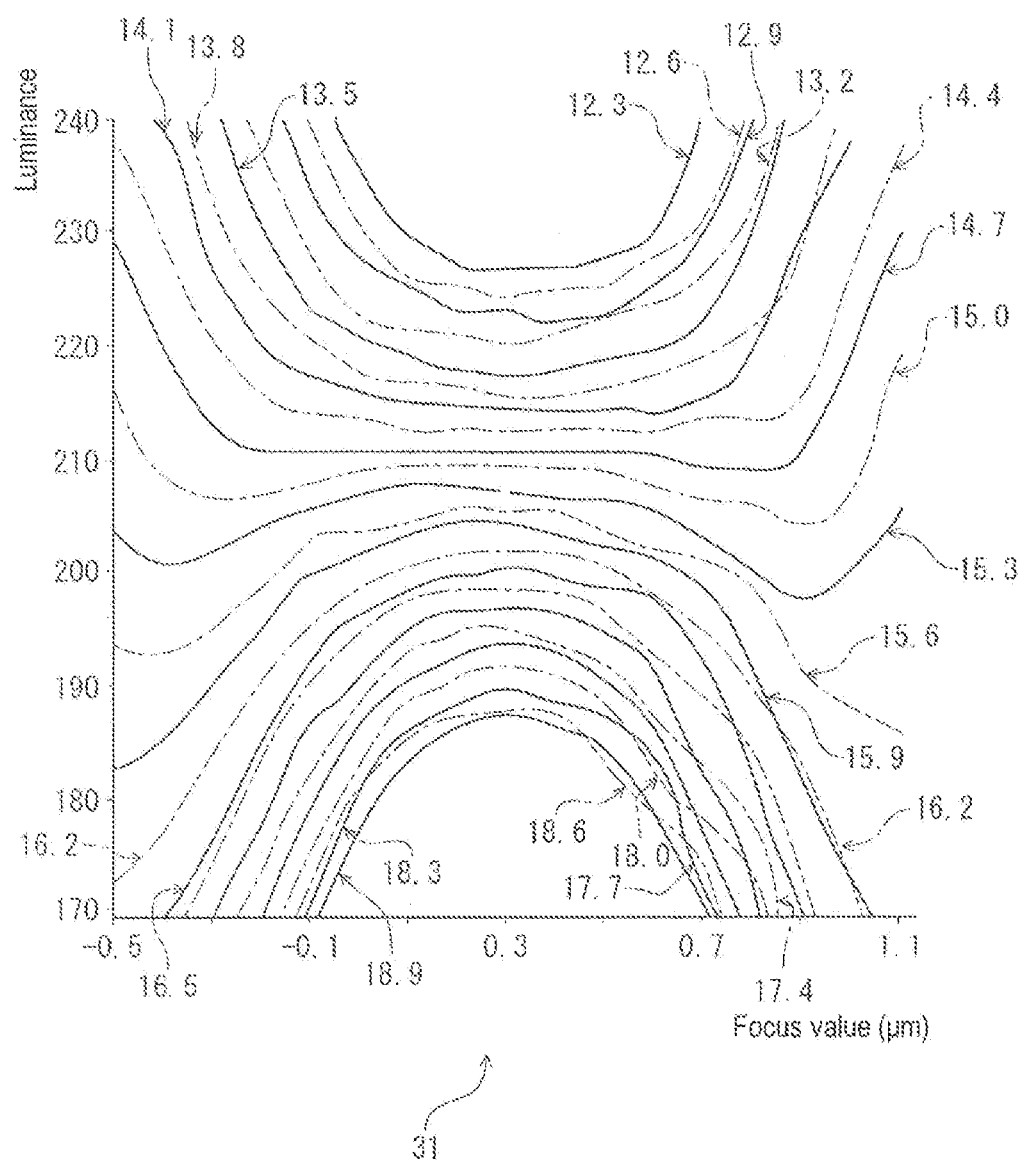
FIG. 4 is a graph showing a correspondence relationship between luminances, focus values and exposure amounts, which are obtained from a reference wafer.

The substrate imaging apparatus 1 displays a graph 31 (which is referred to as a "reference graph"), which illustrates a correspondence relationship between a median (middle value) of a luminance of each of the exposure sectors 25 and the exposure amount and the focus value set at each of the exposure sectors 25, based on image data (which is referred to as a "reference image data") obtained by imaging the reference wafer W1. FIG. 4 shows an example of the reference graph 31, with the focus value (unit: μm) as the horizontal axis and the median of the luminance as the vertical axis. In FIG. 4, a plurality of graph lines is drawn for respective exposure amounts. Each of the numerical values indicated in the reference graph 31 represents an exposure amount of a respective graph line indicated by an arrow.

Figure 5:
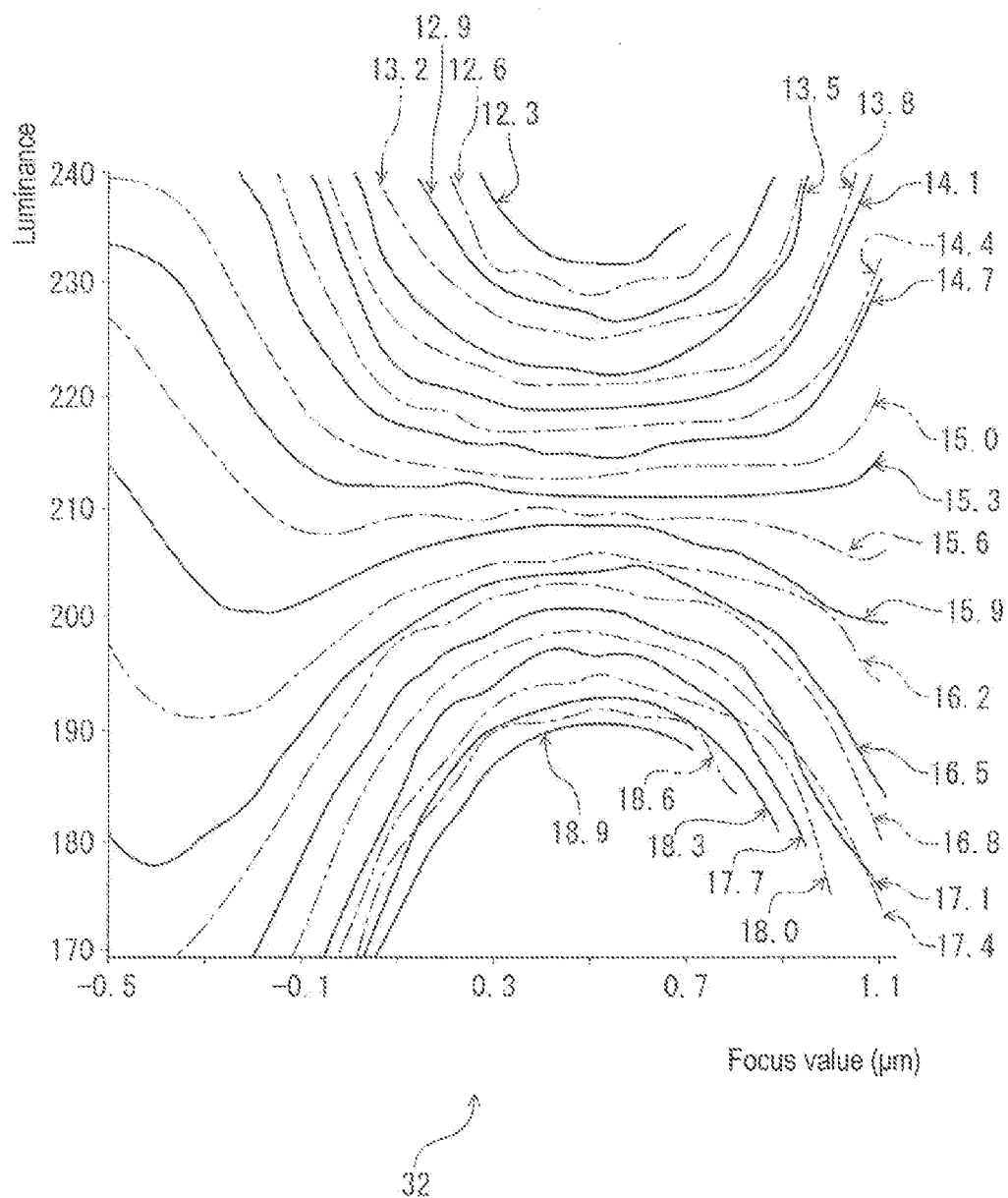
FIG. 5 is a graph showing a correspondence relationship between luminances, focus values and exposure amounts, which are obtained from an inspection wafer.

Further, the substrate imaging apparatus 1 displays a graph 32 (which is referred to as a "inspection graph"), which shows a correspondence relationship between a median (middle value) of a luminance of each of the exposure sectors 25 and the exposure amount and the focus value set at each of the exposure sectors 25, based on an image data (which is sometimes referred to as an "inspection image data") obtained by imaging the inspection wafer W2. FIG. 5 shows an example of the inspection graph 32, with the focus value (unit: μm) as the horizontal axis and the luminance as the vertical axis, similarly to the reference graph 31. In FIG. 5, a plurality of graph lines is drawn for respective exposure amounts.

As described above, when the reference wafer W1 is formed, the focus value and the exposure amount of the exposure apparatus are set to 0.3 μm and 15.6 mJ/cm$^2$ respectively, such that a pattern having an intended dimension is obtained. The reference graph 31 illustrates that under such conditions, the luminance of the exposure sector 25 is 205. Meanwhile, since a slight change of the focus value hardly changes the dimension (i.e., luminance) of the pattern, in some embodiments, the proper focus value may be set to a value corresponding to the peak of a respective graph line. Further, the inspection graph 32 illustrates that the peak is at the value corresponding to 0.5 μm. That is, the proper focus value is 0.5 μm. Further, for the proper focus value of 0.5 μm, the exposure amount corresponding to the luminance of 205 is 16.2 mJ/cm$^2$. Therefore, when forming the inspection wafer W2, the focus value and the exposure amount of the exposure apparatus are set to 0.5 μm and 16.2 mJ/cm$^2$, respectively, which makes it possible to form a pattern having an intended line width on the wafer W. Thus, a user sets the focus value and the exposure amount of the exposure apparatus, in a manner as described above.

Figure 6:
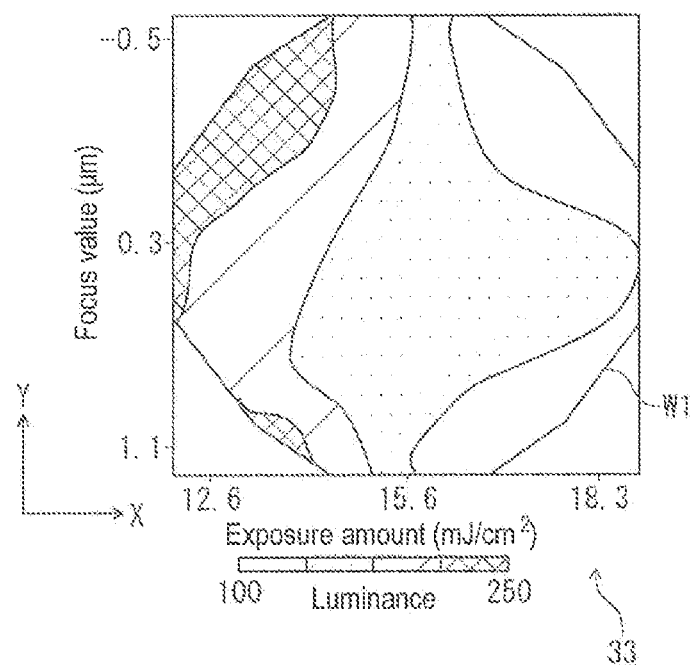
FIG. 6 shows an example of a graph representing a distribution of luminances obtained from the reference wafer.
Figure 7:
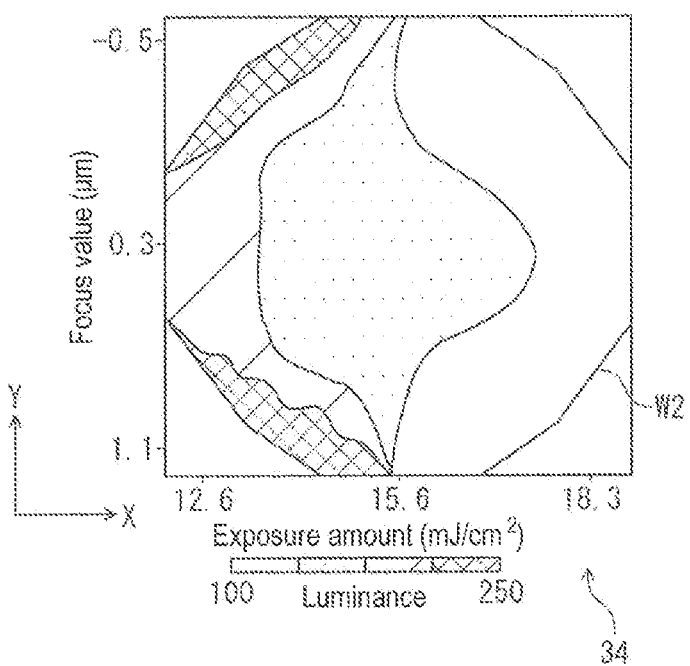
FIG. 7 shows an example of a graph representing a distribution of the luminances obtained from the inspection wafer.

Further, in addition to the display of the aforementioned graphs, the substrate imaging apparatus 1 displays maps which show a distribution of the luminances (or light-dark values) of each of the reference wafer W1 and the inspection wafer W2 based on the reference image data and the inspection image data, respectively. FIG. 6 shows an example of a graph 33 (which is referred to as a "reference map") representing a luminance distribution on the surface of the reference wafer W1, and FIG. 7 shows an example of a graph 34 (which is referred to as an "inspection map") representing a luminance distribution on the surface of the inspection wafer W2.

The reference map 33 is obtained by displaying respective positions on the surface of the reference wafer W1 in a color corresponding to a median of a luminance of a respective exposure sector 25 of the reference wafer W1. In practice, the reference map 33 is displayed with a gradation on the surface of the reference wafer W1. The displayed color allows the user to check the luminance of the respective sector on the surface of the reference wafer W1. The inspection map 34 is similar to the reference map 33 excepted that displaying respective positions on the surface of the inspection wafer W2 in a color corresponding to a median of a luminance of a respective exposure sector 25 of the inspection wafer W. In FIGS. 6 and 7, for convenience, a region having a luminance within a specified range is displayed in a contour line by which each region is separated from each other.

As described above, since the pattern having the intended dimension is formed on the exposure sector 25 positioned at the center of the reference wafer W1, a location displayed in the same color as that of the center exposure sector 25 is searched in the inspection map 34 and an exposure amount and a focus value set at the location are read out from the inspection map 34. Specifically, for example, if in the inspection map 34, a color of a location at which the focus value is 0.5 μm and the exposure amount is 16.2 mJ/cm$^2$ is equal to that of the center of the reference map 33, values of the location are determined to be the focus value and the exposure amount of the exposure apparatus. In this way, it is possible to form the intended pattern on the wafer W similarly to the case of using the reference graph 31 and the reference map 33. Occasionally, depending on the setting of the exposure amount and the focus value, a plurality of locations having the same color as that of the center of the reference map 33 may be displayed in the inspection map 34. Thus, in order to precisely set the exposure amount and the focus value, it is useful to perform the setting by using both reference graph 31 and the inspection graph 32 as described above.

Figure 8:
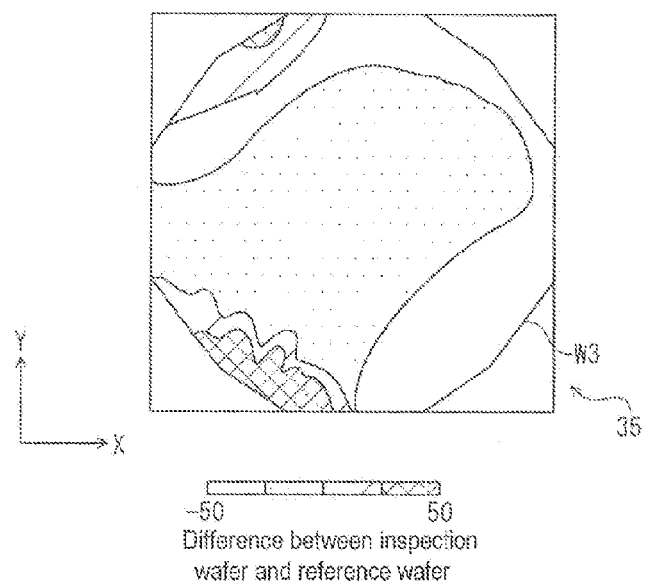
FIG. 8 is a view showing a distribution of differences between the luminances of the reference wafer and the inspection wafer.

Further, the substrate imaging apparatus 1 calculates a difference between luminances of pixels positioned at the same coordinate in both the reference image data and the inspection image data. In addition, as shown in FIG. 8, the substrate imaging apparatus 1 may display a difference map 35 showing a distribution of the difference on the surfaces of the wafers W1 and W2, which are overlapped by aligning the center positions in the X and Y directions (for the sake of simplicity, the overlapped wafers are referred to as a "W3" in FIG. 8). Specifically, differences between medians of luminances of respective exposure sectors 25 in the reference wafer W1 and medians of luminances of respective exposure sectors 25 in the inspection wafer W2 are calculated and displayed. The difference map 35 displays colors representing the calculated differences on the corresponding location on the surface of the overlapped wafer W3, similarly to the reference map 33 and the inspection map 34.

The difference map 35 allows the user to check the offsets between the exposure amount and the focus value at the time of the formation of the reference wafer W1, and the exposure amount and the focus value at the time of the formation of the inspection wafer W2. Specifically, as the offset decreases, respective sectors within the plane of the difference map 35 are displayed in a color representing that the offset is zero or nearly zero. Thus, there is not much of a fluctuation in color on the surface of the wafer W3. Meanwhile, as the offset increases, respective sectors on the surface of the wafer W3 are displayed in a color representing that the offset is increased. Thus, a fluctuation in color on the surface of the wafer W3 is illustrated on the difference map 35.

As described above, in this embodiment, at the time of the formation of the reference wafer W1, the exposure amount and the focus value for forming the pattern having the intended dimension are set to 15.6 mJ/cm$^2$ and 0.3 μm, respectively. The substrate imaging apparatus 1 calculates a correction amount $D_{offset}$ (mJ/cm$^2$) for the exposure amount 15.6 mJ/cm$^2$ and a correction amount $F_{offset}$ (μm) for the focus value 0.3 μm, to form the pattern having the intended dimension at the time of the formation of the inspection wafer W2, by using predetermined calculation methods.

Figure 9:
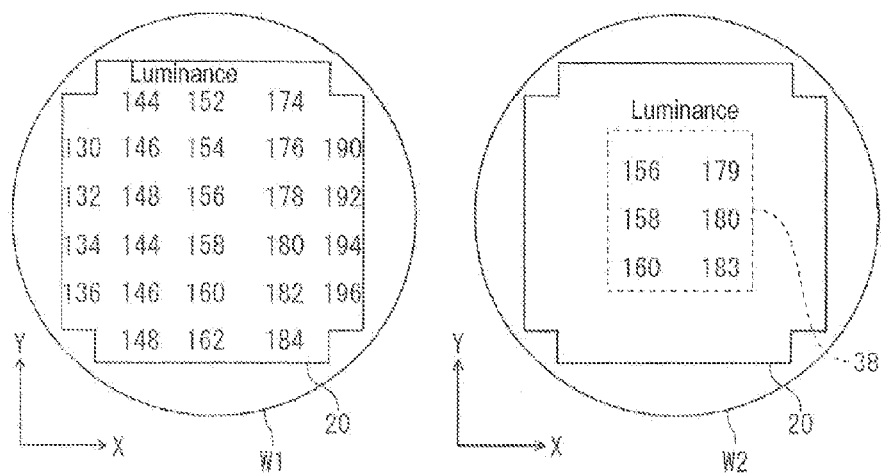
FIG. 9 is a view showing a distribution of the luminances of the reference wafer and the inspection wafer.
Figure 10:
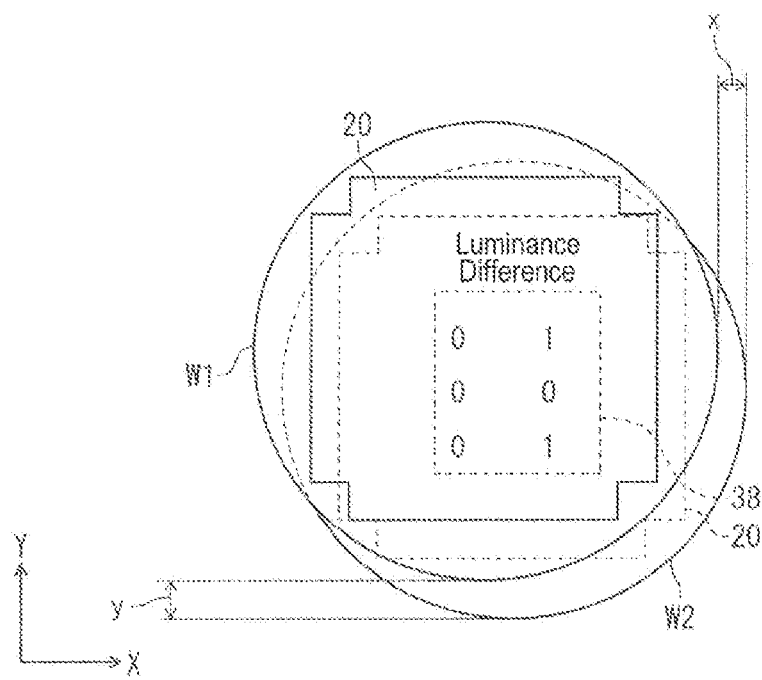
FIG. 10 is a view showing the reference wafer and the inspection wafer which are overlapped based on the distribution of the luminances.

The following is a description on a method of calculating the aforementioned correction amounts. FIG. 9 schematically shows the image data of the reference wafer W1 and the image data of the inspection wafer W2. In FIG. 9, a plurality of values, each representing a luminance of a respective sector, are displayed within the pattern forming area 20 of each of the reference wafer W1 and the inspection wafer W2. By using these image data, a normalized correlation matching is performed based on the luminances of the pattern forming area 20 in the reference wafer W1 and the luminances of, e.g., a predetermined region 38 inside the pattern forming area 20 in the inspection wafer W2. Specifically, in order to minimize differences between the luminances of the pattern forming area 20 in the reference wafer W1 and the luminances of the predetermined area 38 in the inspection wafer W2, the image data of the reference wafer W1 (i.e., the reference image data) and the image data of the inspection wafer W2 (i.e., the inspection image data) are overlapped in such a manner that the X and Y directions are aligned with each other. Each of the image data of the reference wafer W1 and the inspection wafer W2 which are overlapped in the above way is shown in FIG. 10.

As described above, the reference wafer W1 and the inspection wafer W2 are formed by changing the exposure amount and the focus value in the X and Y directions in a stepwise manner, respectively. Accordingly, a position offset x between the image data of the reference wafer W1 and the inspection wafer W2 in the X direction when they are overlapped as described above, corresponds to an offset between the exposure amount at the time of the formation of the reference wafer W1 and the exposure amount at the time of the formation of the inspection wafer W2. Further, a position offset y between the image data of the reference wafer W1 and the inspection wafer W2 in the Y direction corresponds to an offset between the focus value at the time of the formation of the reference wafer W1 and the focus value at the time of the formation of the inspection wafer W2.

Using the below equations Eq. 1 and Eq. 2, the offset between the exposure amounts and the offset between the focus values are calculated based on the position offsets x and y. Each of the calculated offsets represents the correction amount $D_{offset}$ for the exposure amount and the correction amount $F_{offset}$ for the focus value. Although the unit of the position offsets x and y between the two image data detected by the aforementioned manner is a pixel, in practice, the position offsets x and y of the pixel unit are converted into the unit of micrometer by a predetermined calculating method so that the equations Eq. 1 and Eq. 2 are operated on the unit of micrometer. Hereinafter, the position offsets x and y will be described on the unit of micrometer.

$$D_{offset} = D_{step}(x/SSx) \quad \text{Eq. 1}$$

$$F_{offset} = F_{step}(y/SSy) \quad \text{Eq. 2}$$

$D_{step}$ in the equation Eq. 1 represents a difference (unit: mJ/cm$^2$) between the set values of the exposure amounts of the exposure sectors 25 disposed adjacent each other along the X direction. As described above, in this embodiment the difference (unit: mJ/cm$^2$) is 0.3 mJ/cm$^2$. SSx represents the size (unit: μm) of one exposure sector 25 in the X direction. $F_{step}$ in the equation Eq. 2 represents a difference (um) between the set values of the focus values of the exposure sectors 25 disposed adjacent each other along the Y direction. As described above, in this embodiment the difference (μm) is 0.1 μm. SSy represents the size (μm) of one exposure sector 25 in the Y direction. By calculating the correction amounts using the above calculations, it is possible to precisely correct the exposure amount and the focus value as compared with a visual inspection of the graphs and the maps as described above.

Figure 11:
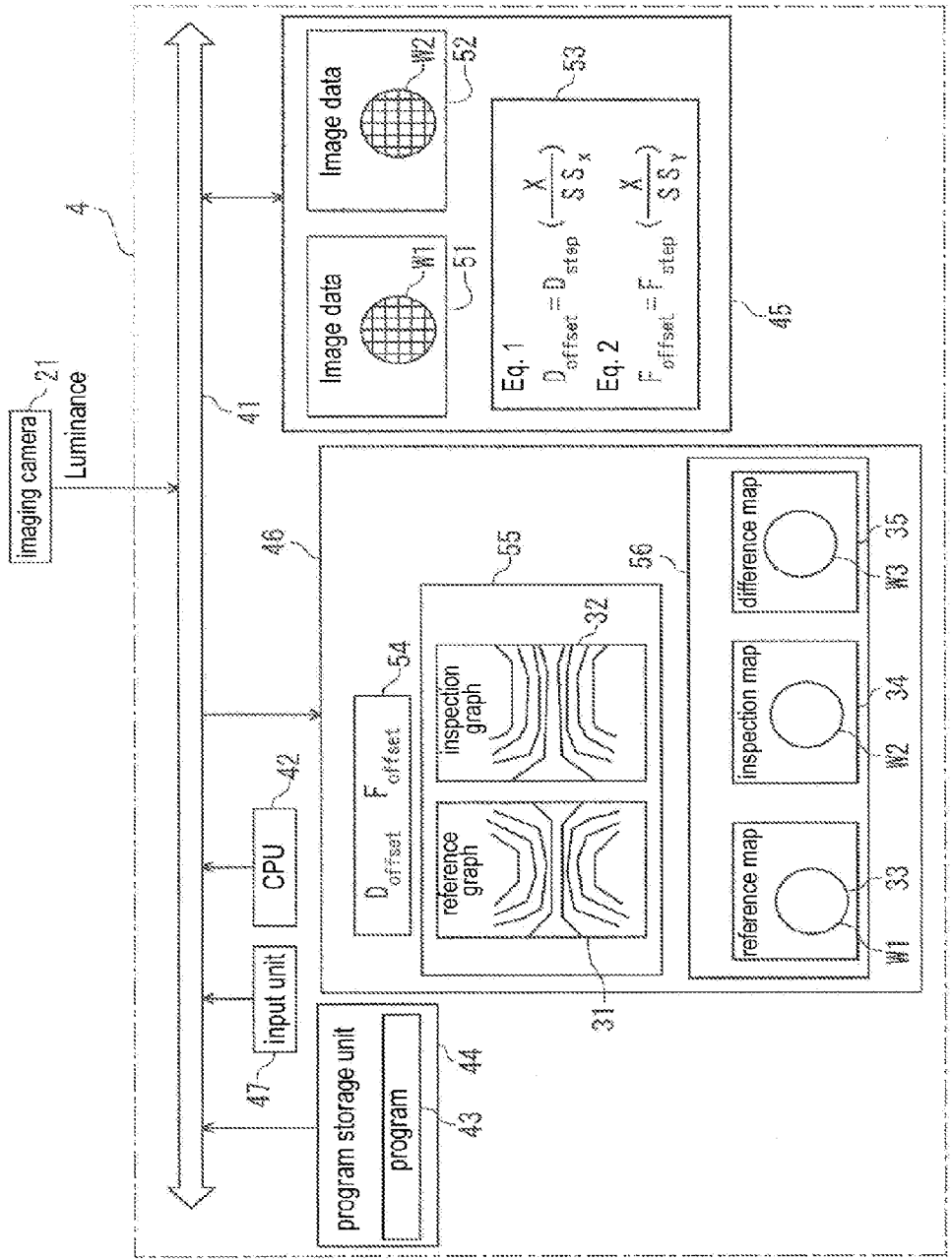
FIG. 11 is a view showing the configuration of a control unit which is provided in the substrate imaging apparatus.

The following description will be made regarding the control unit 4, which is installed in the substrate imaging apparatus 1 to perform various operations as described above. The control unit 4 is configured to determine the proper focus value and the proper exposure amount, with reference to FIG. 11. The control unit 4 includes a bus 41 which is connected to a CPU (Central Processing Unit) 42 configured to perform various operations, a program storage unit 44 to store a program 43 therein, a memory 45, a display unit 46 and an input unit 47. The program 43 stores instructions (respective operations) for the control unit 4 to provide a control signal to respective units of the substrate imaging apparatus 1 such that processes of each mode (which will be described later) are executed. The program storage unit 44 may be composed of a non-transitory computer-readable storage medium, e.g., a flexible disk, a compact disk, a hard disk, MO (Magnetic-Optical) disk or the like.

The memory 45 includes image data storage sections 51 and 52 to store the image data of the reference wafer W1 and the image data of the inspection wafer W2, respectively, and an equation storage section 53 to store the aforementioned equations Eq. 1 and Eq. 2. The display unit 46 includes an operation value display section 54, a graph display section 55 and a map display section 56. The operation value display section 54 displays thereon the $D_{offset}$ and the $F_{offset}$ operated by the aforementioned equations Eq. 1 and Eq.2. The graph display section 55 displays the reference graph 31 and the inspection graph 32, and the map display section 56 displays the reference map 33, the inspection map 34 and the difference map 35. The input unit 47 may include a mouse, a keyboard, a touch panel or the like. The user uses the input unit 47 to operate the substrate imaging apparatus 1, thereby allowing each of the maps and each of the graphs to be displayed, and/or allowing the correction amounts to be operated and displayed by the equations Eq. 1 and Eq. 2.

Figure 12:
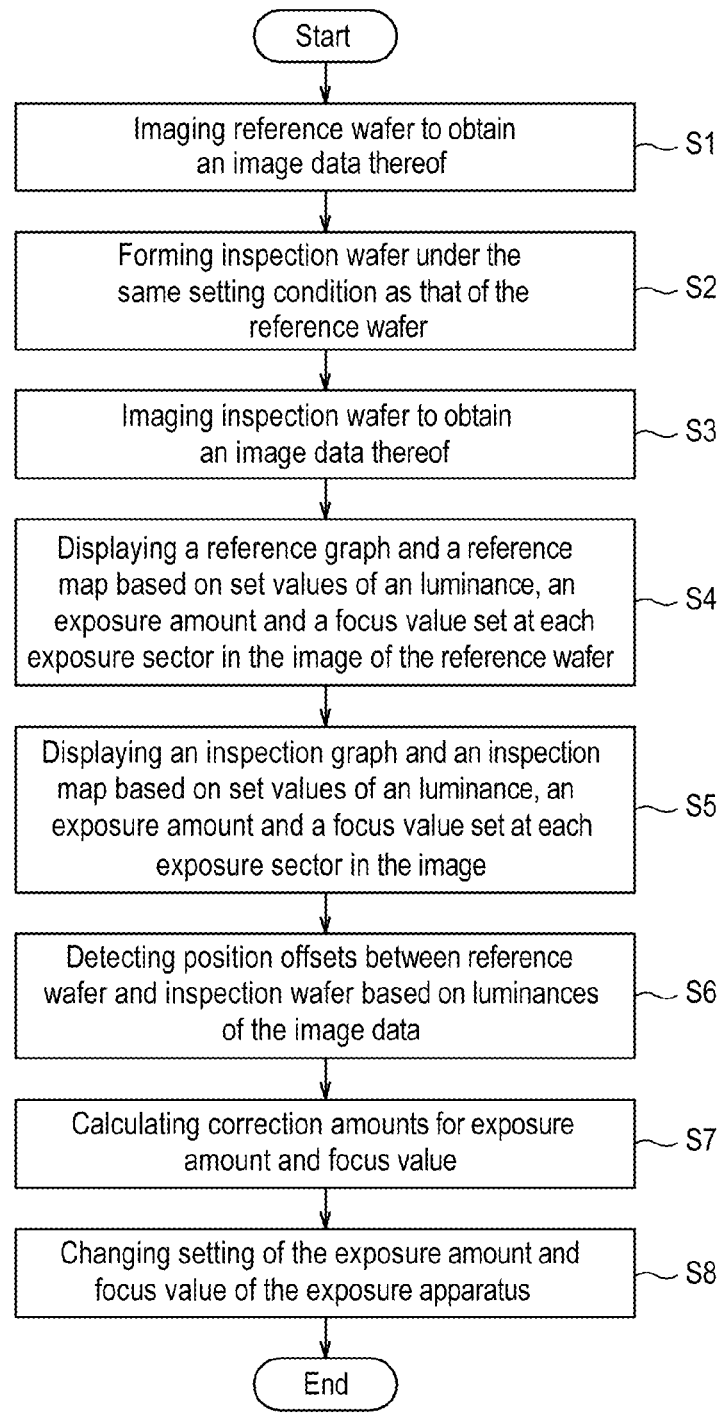
FIG. 12 is a flowchart illustrating the setting method of the present disclosure, which is performed using the substrate imaging apparatus.

The following description will be made on a sequence of setting the exposure amount and the focus value of the exposure apparatus using the substrate imaging apparatus 1 with reference to a flowchart of FIG. 12. The image data of the reference wafer W1 is obtained by forming the reference wafer W1 as described above, moving the reference wafer W1 in a predetermined direction to load on the loading table 11, followed by imaging the reference wafer W1 by the imaging camera 21 while moving the loading table 11 along the guide rail 14 (Operation S1).

Subsequently, after a predetermined period has lapsed from the formation of the reference wafer W1, the inspection wafer W2 is formed by exposing each of the exposure sectors 25 with the same exposure amount and the same focus value as those set for the reference wafer W1, and then developing the same (Operation S2), as described above. Next, the inspection wafer W2 is imaged by the imaging camera 21 similarly to the reference wafer W 1, thereby obtaining the image data of the inspection wafer W2 (Operation S3).

Subsequently, a filtering process such as a smoothing process, an averaging process or the like are performed on each of the obtained image data to remove noises therefrom. Thereafter, for example, if the user inputs a command to the input unit 47, in the image data of the reference wafer W1, the reference graph 31 and the reference map 33 are displayed based on the medians of the luminances (brightness) of the exposure sectors (shots) 25 and the exposure amounts and the focus values set at the exposure sectors 25 (Operation S4).

The inspection graph 32 and the inspection map 34 then are displayed based on the medians of the luminances (brightness) of the exposure sectors (shots) 25 in the image data of the inspection wafer W2 and the exposure amounts and the focus values set at the exposure sectors 25 (Operation S5). Further, differences between luminances of respective pixel of the image data of the reference wafer W1 and luminances of respective pixel of the image data of the inspection wafer W2 are calculated, and the difference map 35 is displayed based on the calculated differences.

Subsequently, the normalized correlation matching is performed on the image data of the reference wafer W1 and the image data of the inspection wafer W2 to calculate the position offsets x and y as shown in FIG. 10 (Operation S6). Next, based on the position offsets x and y, the correction amount $D_{offset}$ for the exposure amount and the correction amount $F_{offset}$ for the focus value are calculated and displayed by the aforementioned equations Eq. 1 and Eq. 2 (Operation S7).

The user reads the proper exposure amount and the proper focus value for obtaining the pattern having the intended dimension from the displayed graphs or the displayed maps, and/or determines values obtained by adding the $D_{offset}$ and the $F_{offset}$ to the exposure amount of 15.6 mJ/cm$^2$ and the focus value of 0.3 μm set at the time of the formation of the reference wafer W1, respectively, as the proper exposure amount and the proper focus value, respectively (Operation S8).

According to the above method of setting the exposure amount and the focus value of the exposure apparatus, the correction operations for the exposure amount and the focus value are performed to obtain the resist pattern having the intended dimension, even in the exposure apparatus in which the inspection wafer W2 is formed based on the luminances of the image of the reference wafer W1 including the exposure sectors 25, which are exposed with the proper exposure amount and the proper focus value for obtaining the resist pattern having the intended dimension, and the luminances of the image of the inspection wafer W2 that is exposed and imaged in a state where the exposure amount and the focus value for each of the exposure sectors 25 are changed. Thus, there is no need to measure the line width of the resist pattern with respect to each of the exposure sectors 25 of the inspection wafer W2 when the correction process is performed, which makes it possible to promptly perform the correction operation. Further, it is possible to promptly monitor a time-dependent change of the exposure amount and the focus value. This increases an operating time of the exposure apparatus due to a decrease in time required to determine each of the correction amounts, to increase a production efficiency of the exposure apparatus, which, in turn, increases a production efficiency of a semiconductor manufacturing device.

While in the above embodiment, all of the operation values obtained from the graphs and the maps and the equations Eq. 1 and Eq. 2 have been described to be displayed, any one of the operation values may be displayed to determine the correction amounts for the exposure amount and the focus value of the exposure apparatus. Further, in some embodiments, for example, the control unit 4 may detect an exposure amount and a focus value from the reference graph 31 and the inspection graph 32, and may provide the same to an actuator (not shown) of the exposure apparatus without displaying such graphs and/or maps, and calculated values may be provided to the user. Further, the actuator may be used to change the setting of the exposure apparatus such that the determined exposure amount and focus value are set. In some embodiments, when the setting of the exposure apparatus is changed by the maps or the operation values, the setting may be changed through the actuator.

While in the above embodiment, the substrate imaging apparatus 1 has been described to image each of the reference wafer W1 and the inspection wafer W2 to obtain each image data corresponding thereto, the present disclosure is not limited thereto. For example, in some embodiments, a plurality of substrate imaging apparatuses 1 may be provided, where one of the plurality of substrate imaging apparatuses 1 images the reference wafer W1 to obtain image data corresponding thereto and sends the same to another substrate imaging apparatus 1 which images the inspection wafer W2, thereby performing the data processing as described above. That is, the image data of the reference wafer W1 is not obtained by another substrate imaging apparatus configured to obtain the image data of the inspection wafer W2.

Further, in the case that the correction operation is performed based on the inspection graph 32 as described above, since a luminance data of the exposure sector 25 with the intended pattern formed thereon is required, the correction operation may be performed by obtaining a value of the luminance data instead of the reference image data. In addition, in the case that the correction operation is performed based on the inspection graph 32, since the luminance data of the exposure sector 25 with the intended pattern formed thereon is required, at least one of the exposure sectors 25 in the reference wafer W1 may be exposed with the proper exposure amount and the proper focus value. Specifically, in the above embodiment, only the exposure sector 25 positioned at the center of the reference wafer W1 is exposed with the exposure amount 15.6 mJ/cm$^2$ and the focus value 0.3 μm and the other exposure sectors 25 are imaged without the exposure, thereby obtaining a luminance of the center exposure sector 25 and reading the proper exposure amount out the inspection graph 32 based on the obtained luminance. In this case, the proper focus value is determined as a value that is obtained by reading a peak of a waveform of the inspection graph 32, like the above embodiment. As described above, by changing the exposure amount and the focus value for each exposure sector 25 and displaying the reference graph 31, the user is able to check whether the setting of the focus value of the exposure sector 25 positioned at the center of the reference wafer W1 is suitable based on the waveform of the reference graph 31. Accordingly, as described above, the reference wafer W1 may be formed at least by changing the setting of the focus value for every exposure sector 25.

Further, while in the above embodiment, the reference wafer W1 and the inspection wafer W2 have been described to be exposed by the same exposure apparatus, different exposure apparatuses may be used to expose the reference wafer W1 and the inspection wafer W2. Even in this case, like the above embodiment, the reference wafer W1 is imaged and the luminance of the exposure sector 25 whose the proper exposure amount and the proper focus value are set is calculated from the reference image data, thereby reading an exposure amount corresponding to the calculated luminance from the inspection graph 32. Similarly, even in the case where the maps are used, the reference wafer W1 and the inspection wafer W2 may be exposed by different exposure apparatus. In the case where the correction amounts are determined by the normalized correlation matching and the equations as described above, the position offsets x and y between the aforementioned image data correspond to a change in offset between set values of the exposure amount and the focus value at the time of the formation of both the reference wafer W1 and the inspection wafer W2 and actual values, in the same exposure apparatus. As such, the reference wafer W1 and the inspection wafer W2 are formed by being exposed by the same exposure apparatus.

When the matching is performed to obtain the correction amounts by the equations Eq. 1 and 2, for a color image data, the matching is performed such that luminance of each of RGB in each pixel is minimized, thereby determining calculating the offsets x and y. Specifically, the image data may be a monochrome image data or a color image data. Further, while in the above embodiment, medians of luminances of respective exposure sectors 25 in the reference wafer W1 and the inspection wafer W2 are calculated to obtain the graphs 31 and 32 and the maps 33 and 34, the present disclosure is not limited thereto. In some embodiments, an average of a luminance of each exposure sector 25 may be calculated instead of the medians, thereby obtaining the graphs 31 and 32 and the maps 33 and 34.

<Evaluation Test 1>

Like the above embodiment, the reference wafer W1 and the inspection wafer W2 were are formed, and then a line width, which is a dimension of a resist pattern of the exposure sector 25 positioned at the center of each of the reference wafer W1 and the inspection wafer W2, was determined by an optical CD (Critical Dimension) measuring unit. Based on the measurements, a graph was obtained which represents a correspondence relationship between the line widths and the focus values and the exposure amounts with respect to each of the reference wafer W1 and the inspection wafer W2. In obtaining the graph, line widths were measured in 379 places for each of the reference wafer W1 and the inspection wafer W2.

A description will be further made on each of the reference wafer W1 and the inspection wafer W2 used in this test. In order to form a pattern having a line width of 112 nm as an intended dimension on the exposure sector 25 positioned at the center on the surface of the reference wafer W1, the exposure amount and the focus value were set to be 15.6 mJ/cm$^2$ and 0.3 μm, respectively. And, like the above embodiment, the exposure amount was set to be changed by 0.3 mJ/cm$^2$ in the exposure sectors 25 disposed adjacent each other in the X direction, and the focus value was set to be changed by 0.1 μm in the exposure sectors 25 disposed adjacent each other in the Y direction. The size of one exposure sector 25 in the X direction is 11040 μm and the size thereof in the Y direction is 14560 μm. Similarly, the inspection wafer W2 was formed by the same setting as that of the reference wafer W1.

Figure 13:
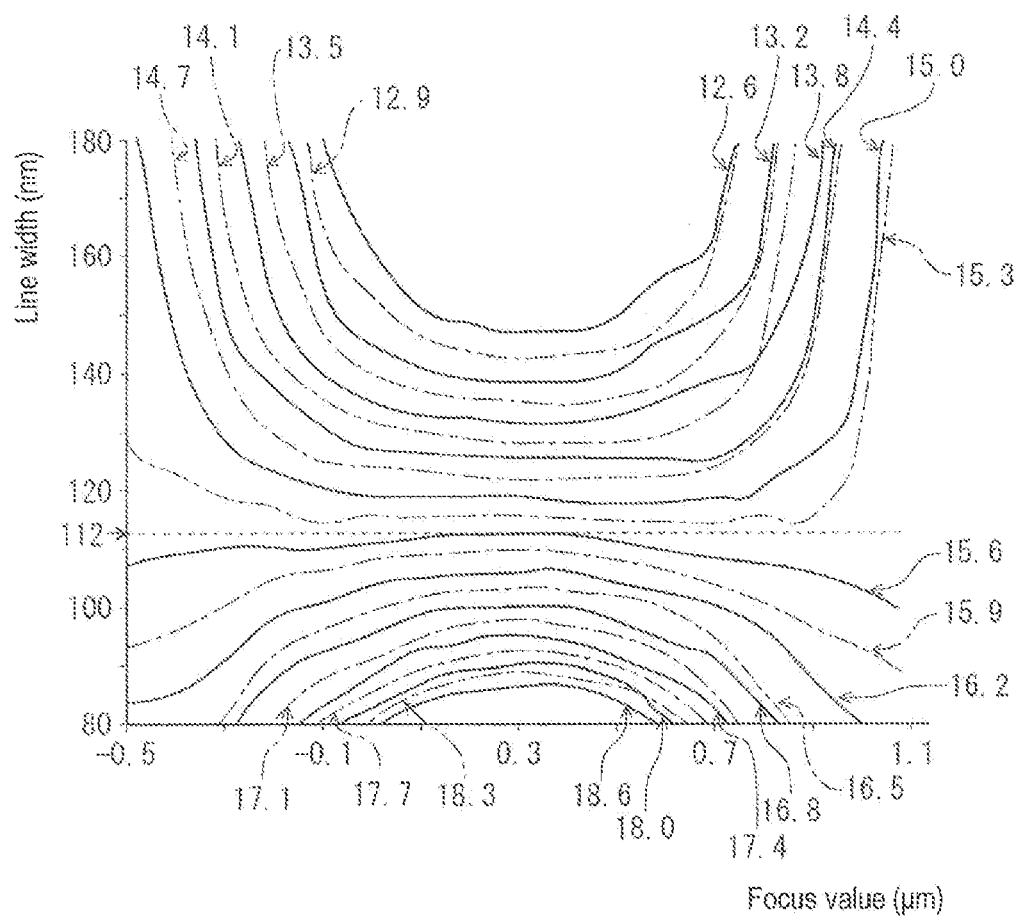
FIG. 13 is a graph showing a correspondence relationship between line widths of patterns, focus values and exposure amounts, which are obtained from the reference wafer in an evaluation test.

FIG. 13 is a graph showing a correspondence relationship between line widths and exposure amounts and focus values which are measured with respect to the reference wafer W1. FIG. 13 corresponds to the reference graph 31 shown in FIG. 4, with a line width (unit: nm) of a pattern as the vertical axis instead of the luminance. In FIG. 13, each of numerical numbers which is indicated to point a line of a respective graph by a respective arrow represents an exposure amount. Peaks of the lines of the respective graphs are in a place where the focus value is 0.3 μm. That is, since line widths in the vicinity of the focus value 0.3 μm are not substantially changed, the value 0.3 μm is the proper focus value. It was found that, when the focus value is 0.3 μm and the exposure amount is 15.6 mJ/cm$^2$, an intended line width, i.e., 112 nm is obtained.

Figure 14:
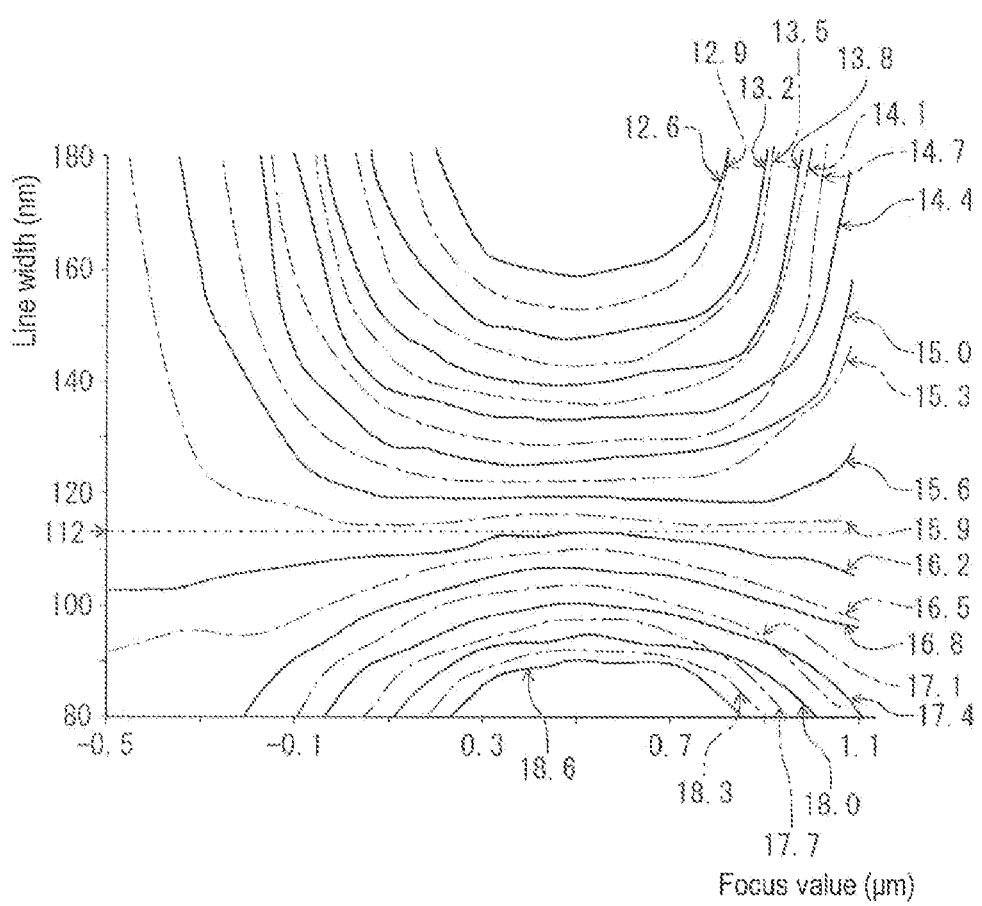
FIG. 14 is a graph showing a correspondence relationship between line widths of patterns, focus values and exposure amounts, which are obtained from the inspection wafer in the evaluation test.

FIG. 14 is a graph showing a correspondence relationship between line widths and exposure amounts and focus values which are measured with respect to the inspection wafer W2. In the graph of FIG. 14, the horizontal axis represents a focus value and the vertical axis represents a line width, like the reference graph 31 shown in FIG. 13. Peaks of lines of respective graphs are in a place where the focus value is 0.5 μm. And, when the focus value is 0.5 μm, an exposure amount corresponding to the intended line width 112 nm was 16.2 mJ/cm$^2$. Thus, the exposure amount and the focus value which are proper to set the line width of the pattern to be 112 nm were 16.2 mJ/cm$^2$ and 0.5 μm, respectively. Accordingly, the correction amount for the exposure amount and the correction amount for the focus value at the time of the formation of the reference wafer W1, were 16.2-15.6=+0.6 mJ/cm$^2$, and 0.5-0.3=+0.2 μm, respectively. In the evaluation test 1, the time took to display the graphs after the launch of imaging the reference wafer W1 and the inspection wafer W2 was 1800 seconds.

<Evaluation Test 2>

In the evaluation test 2, image data of images of the reference wafer W1 and the inspection wafer W2 were obtained by the same operation as that of the above embodiment similarly to the evaluation test 1, and then position offsets x and y between two image data as described above were calculated. And then, a correction amount $D_{offset}$ for the exposure amount and a correction amount $F_{offset}$ for the focus value were calculated using the equations Eq. 1 and Eq. 2 based the position offsets x and y. As a result, the position offset x was 17581 μm, the position offset y was 25915 μm, the calculated correction amount $D_{offset}$ was +0.48 cm$^2$, and the calculated correction amount $F_{offset}$ was +0.18 μm. In this evaluation test 2, the time took to display the correction amounts after the launch of imaging the reference wafer W1 and the inspection wafer W2 was 15 seconds. Each of the correction amounts obtained by the evaluation tests 1 and 2 in this way become close to each other. The evaluation test 2 has shown that a time needed to obtain the correction amounts is shorter, as compared with the evaluation test 1. This provides the effects of the present disclosure.

According to the present disclosure, since focus values and exposure amounts of an exposure apparatus are determined based on luminances obtained by imaging a plurality of exposure sectors of a reference substrate with a pattern formed thereon and luminances obtained by imaging a plurality of exposure sectors of an inspection substrate with a pattern formed thereon, there is no need to measure a dimension of the pattern of each of the plurality of exposure sectors in the inspection substrate. Thus, it is possible to promptly set the exposure amounts and the focus values of the exposure apparatus, thereby improving a production efficiency of the exposure apparatus.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of setting an exposure apparatus to expose exposure sectors defined on a resist film formed on a surface of a substrate with proper values of an exposure amount and a focus value for forming a pattern having a predetermined dimension, the method comprising:

exposing and developing an exposure sector defined on a reference substrate by a first exposure apparatus having a first state where each of the proper values for the exposure amount and the focus value is predetermined, and imaging the reference substrate on which the pattern is formed to obtain reference data including luminance of the exposure sector of the reference substrate without measuring the dimension of the pattern;

exposing and developing a plurality of exposure sectors defined on an inspection substrate by a second exposure apparatus having a second state where at least one of the exposure amount and the focus value is unknown, and forming a pattern on the inspection substrate, wherein the exposure amount and the focus value differ in each of the plurality of exposure sectors of the inspection substrate;

imaging the inspection substrate with the pattern formed thereon, and obtaining inspection image data including luminances of the plurality of exposure sectors without measuring the dimension of the pattern; and determining the proper values for the exposure amount and the focus value for the second state based on the luminance of the exposure sector of the reference data and the luminances of each of the exposure sectors of the inspection image data without measuring the dimension of the pattern.

2. The method of claim 1, wherein the reference substrate further includes a plurality of exposure sectors defined in a matrix form in first and second directions, and the inspection substrate includes the plurality of exposure sectors defined in a matrix form in first and second directions, wherein each of the exposure sectors is exposed so that the exposure amount increases as it goes from one end of the first direction to the other end, and the focus value increases as it goes from one end of the second direction to the other end; and wherein the reference data includes luminance of each of the exposure sectors of the reference substrate.

3. The method of claim 2, wherein the first exposure apparatus having the first state and the second exposure apparatus having the second state are same, wherein the determining the proper values for the exposure amount and the focus value includes:

overlapping the reference data of the reference substrate and the inspection image data of the inspection substrate;

calculating offsets between the overlapped data based on the luminance of each of the exposure sectors of the reference substrate and the luminance of each of the exposure sectors of the inspection substrate; and determining the proper values for the exposure amount and the focus value based on the calculated offsets using predetermined equations.

4. The method of claim 2, further comprising:

calculating differences between the luminance of each of the exposure sectors of the reference substrate and the luminance of each of the exposure sectors of the inspection substrate, which correspond to each of the exposure sectors of the reference substrate; and displaying the calculated differences.

5. The method of claim 1, wherein at least one of the exposure sectors of the reference substrate is exposed with the proper values for the exposure amount and the focus value, wherein the method further comprises:

displaying a correspondence relationship between the luminance of each of the exposure sectors of the inspection substrate, and the exposure amount and the focus value applied at the time of the exposure of each of the exposure sectors of the inspection substrate, wherein the proper values for the exposure amount and the focus value are determined based on the displayed correspondence relationship and the luminances of the exposure sectors of the reference substrate.

6. A non-transitory computer-readable storage medium storing a program for causing a computer to perform the method of claim 1, for use in a substrate imaging apparatus configured to image an inspection substrate having a pattern which is formed by exposing a plurality of exposure sectors defined on the inspection substrate with different exposure amounts and focus values with regard to each of the exposure sectors and developing the exposed inspection substrate, by an exposure apparatus having a state where at least one of the proper values of the exposure amount and the focus value for forming the pattern having the predetermined dimension is unknown.

7. A substrate imaging apparatus for use in setting an exposure apparatus to expose an exposure sector defined on a resist film formed on a surface of a substrate with proper values for an exposure amount and a focus value for forming a pattern having a predetermined dimension, the apparatus comprising:

a reference data storing unit configured to store reference data including luminance of an exposure sector defined on a reference substrate, wherein the reference data is obtained by exposing and developing the exposure sector of the reference substrate by a first exposure apparatus having a first state where each of the proper values for the exposure amount and the focus value is predetermined, forming a pattern on the reference substrate, and imaging the reference substrate with the pattern;

an imaging unit configured to image an inspection substrate having a plurality of patterns formed by exposing and developing a plurality of exposure sectors defined on the inspection substrate so that the exposure amount and the focus value are changed for each of the plurality of exposure sectors by a second exposure apparatus having a second state where at least one of the exposure amount and the focus value is unknown;

an inspection image data storing unit configured to store an inspection image data including luminances of each of the plurality of exposure sectors of the inspection substrate without measuring the dimension of the pattern; and a determination unit configured to determine the proper values for the exposure amount and the focus value under the second state based on the luminance of the reference data stored in the reference data storing unit without measuring the dimension of the pattern and the luminances of the inspection image data stored in the inspection image data storing unit without measuring the dimension of the pattern.

8. The apparatus of claim 7, wherein the determination unit further includes a display unit configured to display the luminance of the exposure sector of the reference substrate, and configured to display a correspondence relationship between the luminances of each of the exposure sectors of the inspection substrate and the exposure amount and the focus value which are set to expose each of the exposure sectors of the inspection substrate.

9. The apparatus of claim 8, wherein the reference substrate further includes a plurality of exposure sectors which are to be exposed with different exposure amounts and focus values, respectively, wherein the reference data includes luminance data of each of the plurality of the exposure sectors of the reference substrate, and wherein the display unit is configured to display a correspondence relationship between the luminances of each of the plurality of the exposure sectors of the reference substrate and exposure amounts and focus values set at each of the plurality of exposure sectors of the reference substrate.

10. The apparatus of claim 7, wherein the reference substrate and the inspection substrate are exposed by the same exposure apparatus, wherein the reference substrate and the inspection substrate include a plurality of exposure sectors in a matrix form in first and second directions, wherein each of the plurality of exposure sectors of the reference substrate and the inspection substrate are exposed so that the exposure amount increases from one end of the first direction to the other end, and the focus value increases from one end of the second direction to the other end, wherein the reference data and the inspection data include luminance of each of the exposure sectors, and wherein the determination unit includes a calculation unit configured to calculate offsets between the of the reference data of the reference substrate and the inspection image data of the inspection substrate which are overlapped, based on the luminance of each of the exposure sectors of the reference substrate and the luminance of each of the exposure sectors of the inspection substrate, and to determine the proper values for the exposure amount and the focus value based on the calculated offsets using predetermined equations.

* * * * *